(12) United States Patent
Shindo

(10) Patent No.: US 10,748,796 B2
(45) Date of Patent: Aug. 18, 2020

(54) SUBSTRATE PROCESSING APPARATUS

(71) Applicant: TOKYO ELECTRON LIMITED, Tokyo (JP)

(72) Inventor: Takehiro Shindo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/410,546

(22) Filed: May 13, 2019

(65) Prior Publication Data
US 2019/0355599 A1    Nov. 21, 2019

(30) Foreign Application Priority Data
May 15, 2018   (JP) .................................. 2018-094049

(51) Int. Cl.
*H01L 21/677* (2006.01)
*H01L 21/67* (2006.01)
*H01L 21/683* (2006.01)

(52) U.S. Cl.
CPC .. *H01L 21/67196* (2013.01); *H01L 21/67184* (2013.01); *H01L 21/67706* (2013.01); *H01L 21/67742* (2013.01); *H01L 21/67754* (2013.01); *H01L 21/6838* (2013.01)

(58) Field of Classification Search
CPC ................................................. H01L 21/67772
USPC ............................................................ 414/217
See application file for complete search history.

(56) References Cited

U.S. PATENT DOCUMENTS

2008/0124192 A1*   5/2008  Karasawa ......... H01L 21/67379
                                                  414/217

FOREIGN PATENT DOCUMENTS

| JP | 2012-216614 A | 11/2012 |
| JP | 2016-25168 A | 2/2016 |

* cited by examiner

*Primary Examiner* — Saul Rodriguez
*Assistant Examiner* — Willie Berry, Jr.
(74) *Attorney, Agent, or Firm* — Nath, Goldberg & Meyer; Jerald L. Meyer

(57) ABSTRACT

There is provided a substrate processing apparatus that includes: a polygonal transfer chamber; a process chamber connected to the polygonal transfer chamber via a transfer port through which a substrate is transferred; and a transfer mechanism provided in the polygonal transfer chamber and configured to transfer the substrate between the polygonal transfer chamber and the process chamber via the transfer port, wherein the polygonal transfer chamber and the process chamber have regions overlapping each other when viewed from the top.

10 Claims, 9 Drawing Sheets

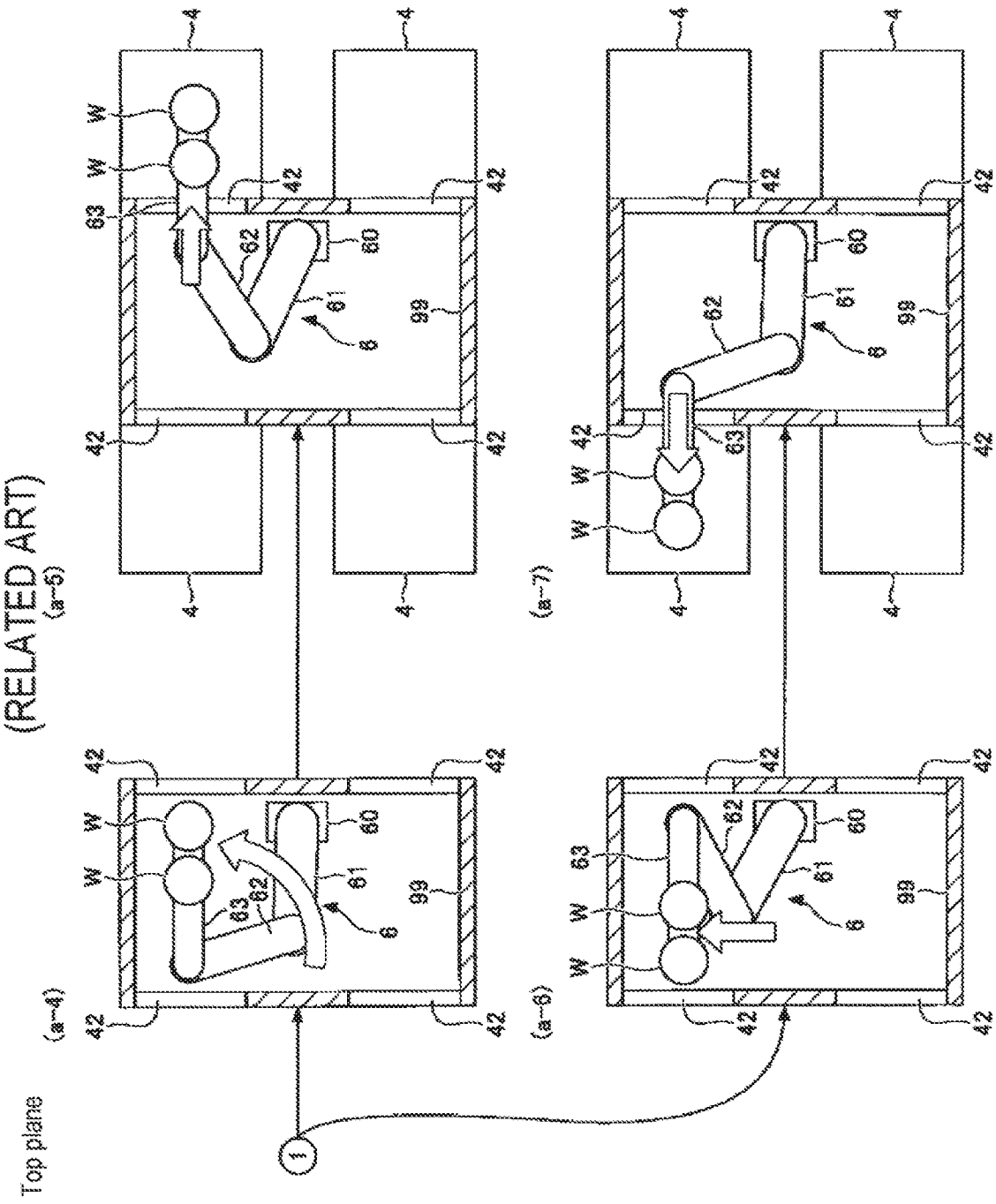

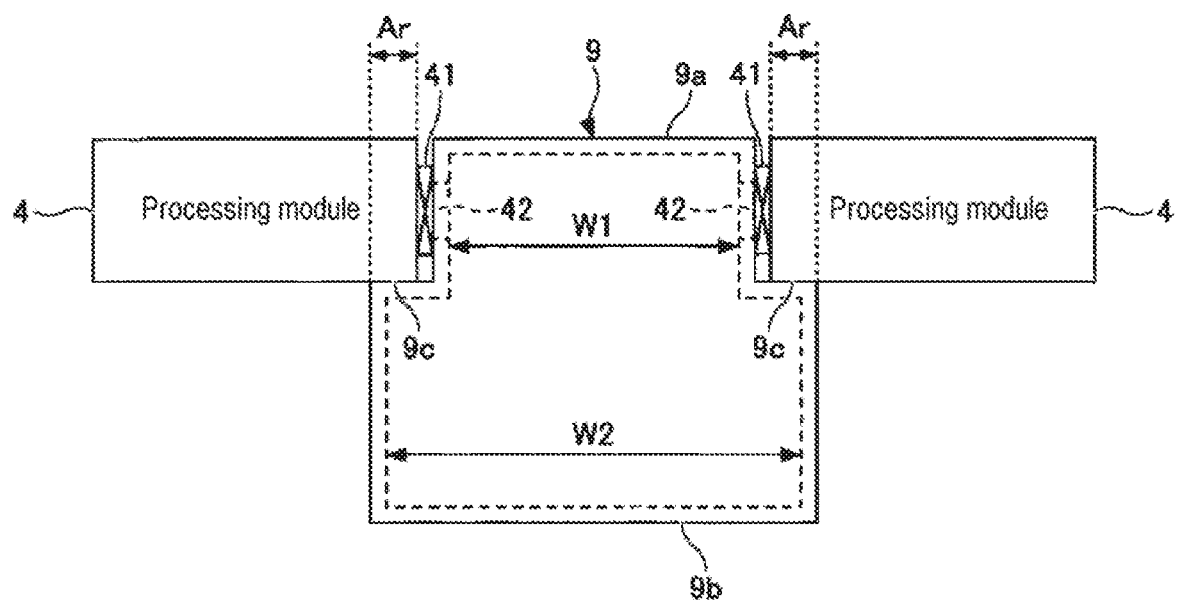

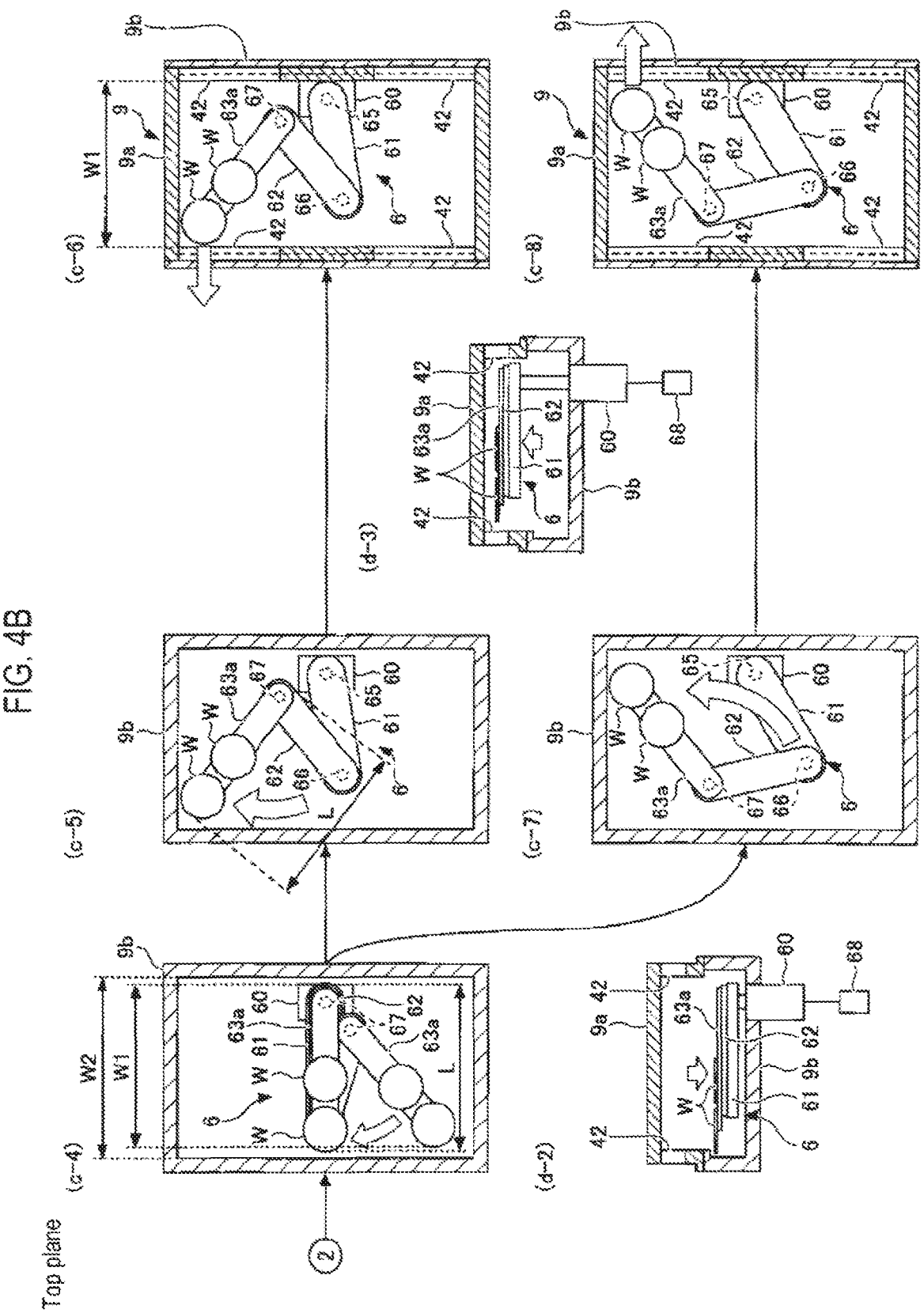

US 10,748,796 B2

SUBSTRATE PROCESSING APPARATUS

CROSS-REFERENCE TO RELATED APPLICATION

This application is based upon and claims the benefit of priority from Japanese Patent Application No. 2018-094049, filed on May 15, 2018, the entire contents of which are incorporated herein by reference.

TECHNICAL FIELD

The present disclosure relates to a substrate processing apparatus.

BACKGROUND

In a substrate processing apparatus that performs vacuum processes such as film formation and etching on a semiconductor wafer (hereinafter, referred to as a "wafer"), a plurality of processing modules are provided in order to enhance productivity. The wafers are processed in each processing module under a vacuum.

A vacuum-side transfer module for transferring a substrate is connected to the plurality of processing modules. A plurality of load lock modules, each configured to switch the internal atmosphere between an atmospheric environment and a vacuum atmosphere, is provided between the vacuum-side transfer module and an atmospheric-side transfer module.

A transfer mechanism equipped with an articulated arm and a sliding mechanism are provided in the vacuum-side transfer module. The transfer mechanism slides in the vacuum-side transfer module using the sliding mechanism and transfers the wafers between the plurality of processing modules and the vacuum-side transfer module and between the vacuum-side transfer module and the load lock modules.

Incidentally, the sliding mechanism is coated with grease. When the wafer is transferred to the processing module by the articulated arm of the transfer mechanism, the grease may enter into the processing module. This may be a cause of contaminating a process chamber. In addition, in a case where the sliding mechanism is provided in the vacuum-side transfer module, the vacuum-side transfer module is increased in size, which increases the footprint of the entire substrate processing apparatus.

On the other hand, in order to transfer the wafers to a plurality of process chambers without having to use the sliding mechanism, the entire length of the articulated arm is required to be lengthened. This increases the size of the vacuum transfer module, thus increasing the footprint of the substrate processing apparatus. It is conceivable to increase the number of arms of the articulated arm and shorten the length of each arm. This complicates the operation of the articulated arm and increases connection locations between the arms and joints. Consequently, there may be a case where a fork cannot pass through a thinly-formed transfer port through which the wafer is transferred, making it impossible to transfer the wafer into the processing module.

SUMMARY

Some embodiments of the present disclosure provide a technique capable of suppressing an increase in footprint of a substrate processing apparatus.

According to an embodiment of the present disclosure, there is provided a substrate processing apparatus, comprising: a polygonal transfer chamber; a process chamber connected to the polygonal transfer chamber via a transfer port through which a substrate is transferred, and a transfer mechanism provided in the polygonal transfer chamber and configured to transfer the substrate between the polygonal transfer chamber and the process chamber via the transfer port, wherein the polygonal transfer chamber and the process chamber have regions overlapping each other when viewed from the top.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1B is a view illustrating an example of the transfer mechanism.

FIG. 3 is a view illustrating an example of a plane taken along line A-A in FIG. 2.

FIG. 4B is a view illustrating an example of the transfer mechanism according to an embodiment of the present disclosure.

DETAILED DESCRIPTION

Figure 1A:
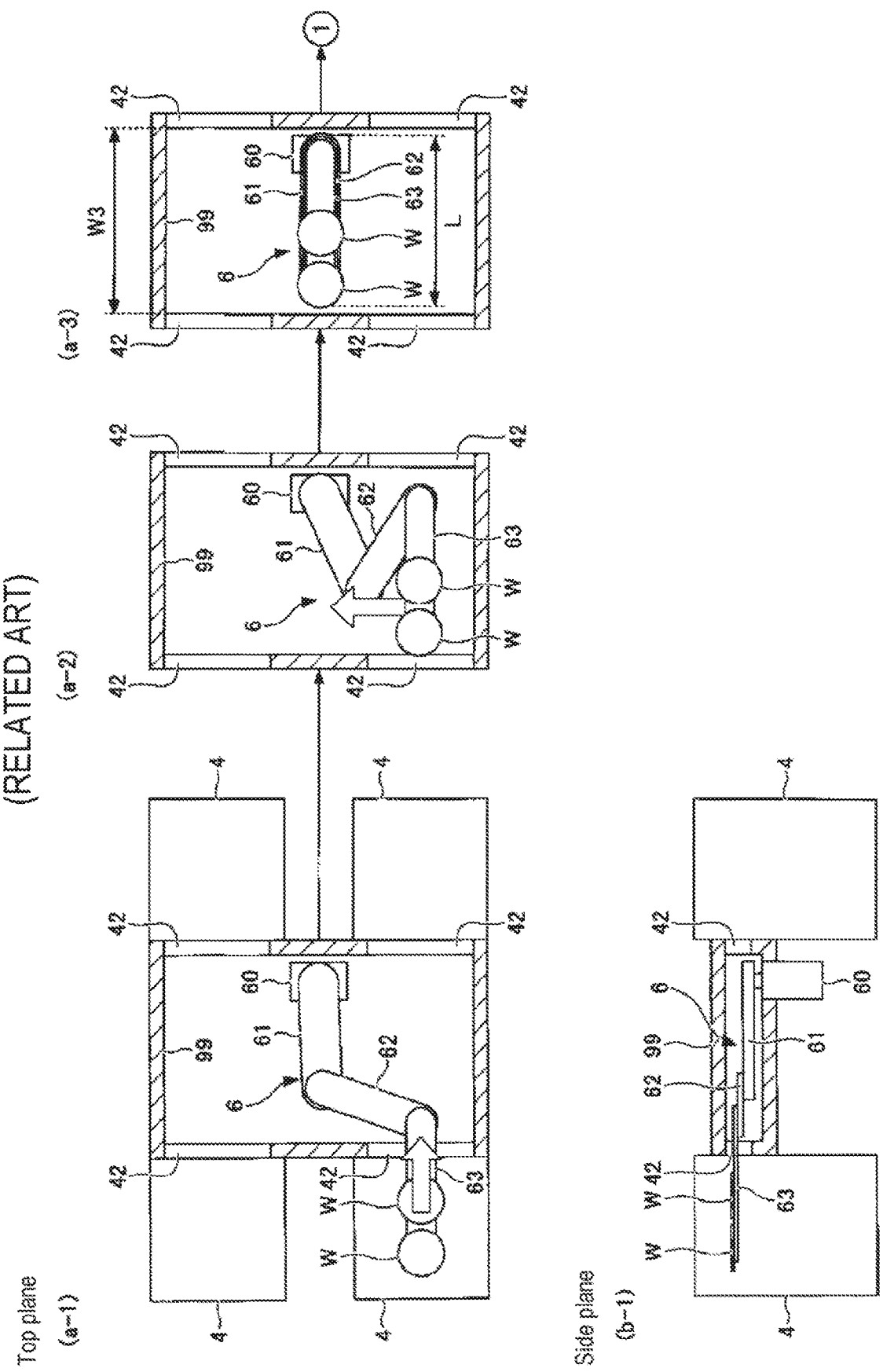
FIG. 1A is a view illustrating an example of a transfer mechanism.

Hereinafter, modes for carrying out the present disclosure will be described with reference to the drawings. Further, in the subject specification and the drawings, substantially identical components will be designed by like reference numerals with the duplicate descriptions thereof omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Operation of Transfer Mechanism]

Prior to describing an operation of a transfer mechanism according to the present embodiment, an operation of a transfer mechanism in a typical substrate processing apparatus will be described with reference to FIGS. 1A and 1B. Four processing modules 4 are arranged in the substrate processing apparatus in a two by two configuration with a transfer module 99 interposed therebetween will be described as an example. The number of processing modules 4 is not limited to four.

In FIG. 1A, upper views illustrate top planes (planes) of the substrate processing apparatus, and a lower view illustrates a side plane thereof. A transfer mechanism 6 having an articulated arm is provided inside the transfer module 99. The transfer mechanism 6 is supported by a base 60.

The articulated arm includes a first arm 61, a second arm 62, and a third arm 63. Two sheets of wafers W are held on the third arm 63. However, the number of wafers W is not limited thereto. For example, one or more wafers W may be held on the third arm 63.

The first arm 61, the second arm 62, and the third arm 63 are connected to each other such that they are rotatable (swingable) and extendible with respect to each other. Thus, the transfer mechanism 6 operates each arm to transfer the wafers W to a respective one of the processing modules 4. In examples illustrated in situations (a-1) and (b-1) of FIG. 1A, in cooperation between the first to third arms 61 to 63, the third arm 63 enters the processing module 4 arranged at the lower left in situation (a-1) of FIG. 1A via a transfer port 42 to mount unprocessed wafers W on predetermined positions inside the processing module 4, and is withdrawn from the processing module 4. Once a predetermined processing is performed on the wafers W, as illustrated in situations (a-2) and (a-3) of FIG. 1A, the third arm 63 enters the respective processing module 4 through the transfer port 42 to unload the processed wafers W. All the first to third arms 61 to 63 are accommodated in the transfer module 99. In situation (a-3) of FIG. 1A, the first arm 61, the second arm 62, and the third arm 63 are folded as a unit when viewed from the plane. In the present disclosure, a state where the third arm 63 is in parallel to a direction along a width W3 of an inner wall of the transfer module 99 as illustrated in situation (a-3) of FIG. 1A or a state where the third arm 63 is in parallel to a direction along a width W1 of the inner wall of the transfer module 9 as illustrated in situation (c-4) of FIG. 4B (to be described later) will be referred to as a parallel state. As illustrated in situation (a-3) of FIG. 1A, a length from a base end portion of the third arm 63 to a tip end of the outermost wafer W, which is mounted on an extended line obtained by connecting the base end portion of the third arm 63 and the leading end portion thereof, is assumed to be "L". The length L is smaller than the width W3 of the inner wall of the transfer module 99 and larger than the width W1 of the inner wall of the transfer module 9.

In FIG. 1B following FIG. 1A, the transfer mechanism 6 transfers the wafers W to a subsequent processing module 4. In a case of the transfer as illustrated in situations (a-4) and (a-5) of FIG. 1B, the transfer mechanism 6 orients the leading end portion of the third arm 63 in a direction opposite that in situation (a-1) of FIG. 1A. Specifically, as illustrated in situation (a-4) of FIG. 1B, the transfer mechanism 6 rotates the second arm 62 and the third arm 63 in a counterclockwise direction so that the direction of the leading end portion of the third arm 63 is inverted. Subsequently, situation (a-4) transitions to situation (a-5) of FIG. 1B by the transfer mechanism 6. The transfer mechanism 6 allows the third arm 63 to enter the subsequent processing module 4 (arranged at the upper right) via the transfer port 42 to transfer the wafers W.

On the other hand, in a case of the transfer as illustrated in situations (a-6) and (a-7) of FIG. 1B, the transfer mechanism 6 moves the leading end portion of the third arm 63 to another transfer port 42 that is formed in the other of the two processing modules 4 arranged side by side on the left long side of the transfer module 99 (moves the leading end portion from the lower left to the upper left in the figure).

In both the transition of situation (a-4) to situation (a-5) and the transition of situation (a-6) to situation (a-7) as illustrated in FIG. 1B, if the length L from the base end portion of the third arm 63 to the tip end of the outermost wafer W that is mounted on the extended line obtained by connecting the base end portion of the third arm 63 and the leading end portion thereof is not smaller than the width W3 of the inner wall of the transfer module 99, the inner wall of the transfer module 99 and the tip end of the outermost wafer W interfere with each other when the third arm 63 is in the parallel state. This makes it difficult to transfer the wafers W to the subsequent processing module 4. This design constraint makes it difficult to set the width W3 of the transfer module 99 in the lateral direction smaller than the length L, which results in an overall increase in footprint of the substrate processing apparatus. In this regard, the substrate processing apparatus according to an embodiment of the present disclosure capable of suppressing the increase in footprint will be described below.

Furthermore, in the following description of the transfer mechanism 6 of the substrate processing apparatus according to the present embodiment, as illustrated in situation (a-3) of FIG. 1A, the lengths from the base end portions to the leading end portions of the respective arms are assumed to be equal to each other.

[Substrate Processing Apparatus]

Figure 2:
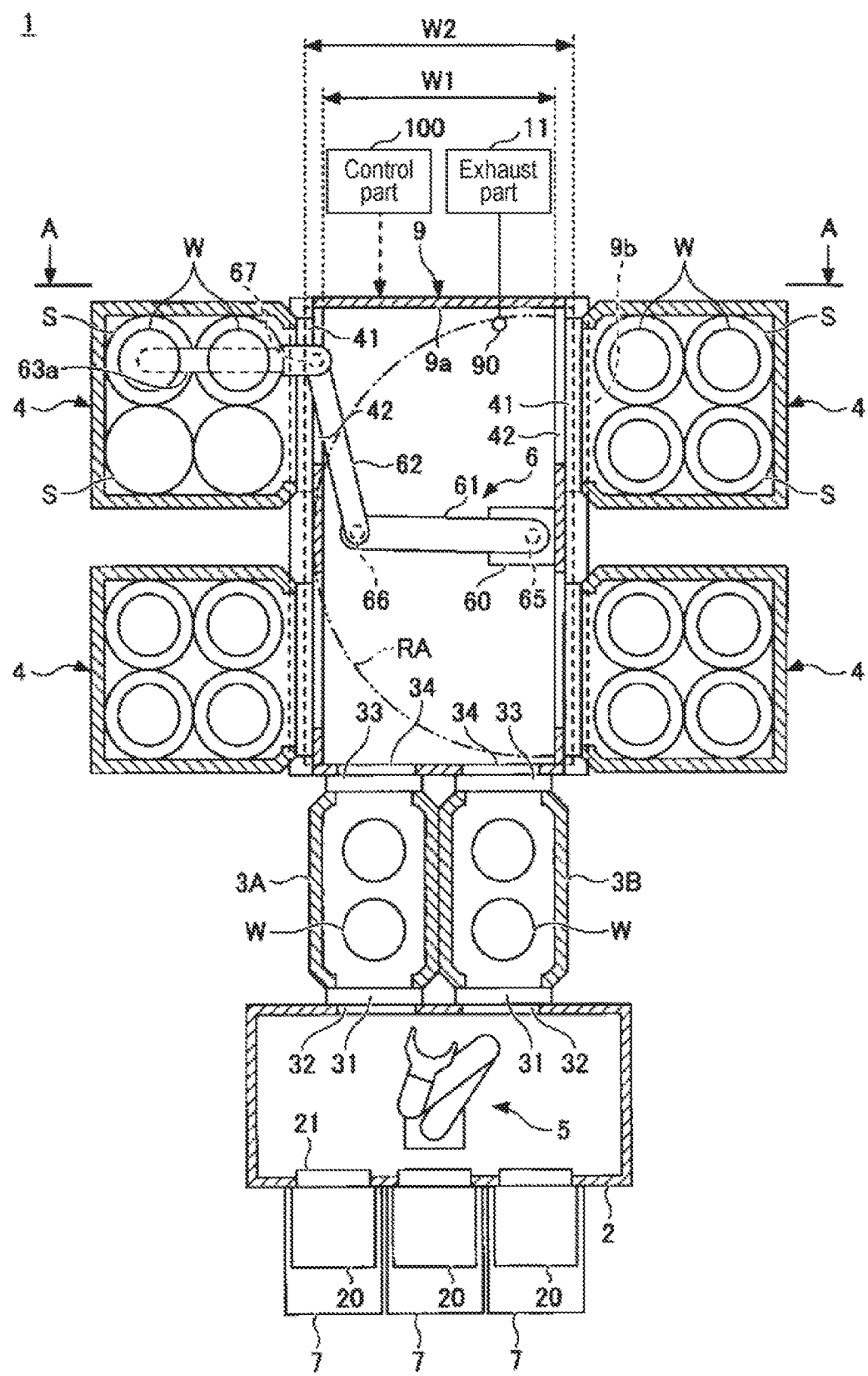
FIG. 2 is a view illustrating an example of a plane of a substrate processing apparatus according to an embodiment of the present disclosure.

First, an example of a configuration of a substrate processing apparatus 1 according to the present embodiment will be described with reference to FIG. 2. FIG. 2 is a view illustrating an example of a plane of the substrate processing apparatus 1 according to the present embodiment. The substrate processing apparatus 1 includes four processing modules 4 and a transfer module 9. The transfer module 9 is configured as a rectangular vacuum transfer chamber. However, the present disclosure is not limited thereto and may be a polygon such as a hexagon or the like.

Each of the processing modules 4 is configured as a rectangular vacuum process chamber where a film forming process, an etching process, an ashing process, and the like are performed. In the present embodiment, the four processing modules 4 are arranged two by two on both sides of the transfer module 9 such that they face each other. The number of processing modules 4 is not limited to four and may be, for example, one or more. In some embodiments, the processing modules 4 may not be arranged to face each other.

Each of the processing modules 4 includes four stages S for mounting respective wafers W thereon. Thus, four wafers W can be simultaneously processed. However, the number of wafers W that can be simultaneously processed inside the processing module 4 is not limited to four, and may be one or more.

The transfer mechanism 6 for transferring the wafers W is provided in the transfer module 9. The transfer mechanism 6 transfers the wafers W between the transfer module 9 and the processing modules 4 via transfer ports 42. The communication between the transfer module 9 and the processing modules 4 is controlled by opening/closing operations of gate valves 41.

The transfer mechanism 6 includes an articulated arm equipped with a first arm 61, a second arm 62 and a third arm 63a, and a base 60 connected to the articulated arm. The base 60 is disposed adjacent to or close to the inner wall of the long side of the transfer module 9. A base end portion of the first arm 61 is rotatably connected to the base 60 via a rotary shaft 65. A base end portion of the second arm 62 is rotatably connected to a leading end portion of the first arm 61 via a rotary shaft 66. A base end portion of the third arm 63a is rotatably connected to a leading end portion of the second arm 62 via a rotary shaft 67.

The third arm 63a is configured to hold two wafers W in a longitudinal direction thereof. The number of wafers W that can be held by the third arm 63a may be one or more. The third arm 63a is an arm located at the tip end of the articulated arm and may be a fork.

Since the third arm 63a can hold the two wafers W, the transfer mechanism 6 can efficiently transfer the wafers W between the four processing modules 4 and the transfer module 9 and between the transfer module 9 and load lock modules 3A and 3B.

The first arm 61, the second arm 62, and the third arm 63a are rotated independently of one another by respective motors via the respective rotary shafts 65, 66 and 67. Furthermore, the rotary shaft 65 connected to the first arm 61 is configured to be extendible by an elevating mechanism 68 (to be described later). Accordingly, the articulated arm can move upward and downward. An exhaust part 11 is connected to an exhaust port 90 formed in the transfer module 9 so as to depressurize the interior of the transfer module 9 to become a vacuum atmosphere of a predetermined pressure.

The two load lock modules 3A and 3B are installed on the short side of the transfer module 9. The two wafers W are mounted in each of the load lock modules 3A and 3B in a horizontal posture. The transfer module 9 is coupled to the load lock modules 3A and 3B via respective gate valves 33 configured to open and close respective transfer ports 34. The wafers W are transferred through the transfer ports 34, respectively. The load lock modules 3A and 3B are coupled to an equipment front end module (EFEM) 2 via respective gate valves 31 configured to open and close respective transfer ports 32. The gate valves 31 are provided in surfaces facing the transfer ports 34 in the load lock modules 3A and 3B. The wafers W are transferred through the transfer ports 32, respectively. The EFEM 2 is a transfer chamber kept at atmospheric pressure.

The interior of each of the load lock modules 3A and 3B provided between the transfer module 9 and the EFEM 2 is switched between an atmospheric environment and a vacuum atmosphere. Accordingly, the wafers W are transferred from the EFEM 2 disposed at the atmospheric side to the transfer module 9 disposed at the vacuum side, or from the transfer module 9 disposed at the vacuum side to the EFEM 2 disposed at the atmospheric side. The number of the load lock modules 3A and 3B is not limited to two and may be one or more.

A transfer arm 5 is provided in the EFEM 2. The transfer arm 5 transfers the wafers W between FOUPs 20 and the load lock modules 3A and 3B. The EFEM 2 includes load ports 7 into which the wafers W are loaded. The FOUPs 20 are mounted on the respective load ports 7. Each of the load ports 7 includes an opening/closing door 21 implemented according to a front-opening interface mechanical standard (FIMS) standard. The opening/closing door 21 moves in a state where the opening/closing door 21 is connected to a lid installed in the FOUP 20. Thus, the interior of the FOUP 20 and the interior of the EFEM 2 are in communication with each other so that the wafers W can be transferred therebetween.

The substrate processing apparatus 1 includes a control part 100 configured to control the transfer of the wafers W and the processing of the wafers W. The control part 100 controls various operations of the substrate processing apparatus 1, such as the film forming process or the like performed in the processing modules 4, the switching of atmosphere performed in the load lock modules 3A and 3B, the transfer operation of the wafers W by the transfer mechanism 6, and the like.

The control part 100 includes a CPU, a read only memory (ROM), a random access memory (RAM), and the like. The CPU controls processes of the processing module 4 according to procedures set in a recipe stored in the RAM or the like. Furthermore, the CPU reads and executes a program for causing the articulated arm of the transfer mechanism 6 or the transfer arm 5 to transfer the wafers W from the RAM, and controls the transfer of the wafers W performed between the FOUPs 20, the EFEM 2, the load lock modules 3A and 3B, the transfer module 9 and the processing modules 4. The program is stored in a storage medium such as a hard disk, a compact disc, a magneto-optical disc, a memory card or the like, and is installed on the RAM.

The configuration of the substrate processing apparatus 1 shown in FIG. 2 is an example of the substrate processing apparatus according to the present disclosure, and is not limited thereto.

[Transfer Module]

Next, the transfer module 9 according to the present embodiment will be described with reference to FIG. 3. FIG. 3 is a view illustrating an example of end surfaces of the transfer module 9 and the processing modules 4 when viewed from a plane taken along line A-A in FIG. 2. For the sake of convenience in description, the inner wall of the transfer module 9 is indicated by a broken line.

The transfer module 9 includes a first transfer chamber 9a, a second transfer chamber 9b, and stepped portions 9c defined at a predetermined height. The first transfer chamber 9a is located above the stepped portions 9c and the second transfer chamber 9b is located below the stepped portions 9c. The processing modules 4 are arranged at both sides of the first transfer chamber 9a above the stepped portions 9c. The transfer ports 42 are formed in the wall surface of the first transfer chamber 9a such that the first transfer chamber 9a is in communication with the processing modules 4. The communication between the first transfer chamber 9a and the processing modules 4 is controlled by opening and closing the transfer ports 42 with the gate valves 41. A width of the inner wall of the first transfer chamber 9a sandwiched between the processing modules 4 is defined as a "first width W1". A width of the inner wall of the second transfer chamber 9b in the same direction as the first width W1 is defined as a "second width W2". The first width W1 is smaller than the second width W2. Thus, the transfer module 9 and the processing modules 4 have regions overlapping by a width Ar shown in FIG. 3 when viewed from the top.

The first transfer chamber 9a and the second transfer chamber 9b are in communication with each other. The substrate processing apparatus 1 includes an elevating mechanism 68 configured to move the transfer mechanism 6 upward and downward between the first transfer chamber 9a and the second transfer chamber 9b (see a situation (d-1) of FIG. 4A).

[Width of Transfer Module]

Turning back to FIG. 2, a dashed double-dotted line RA drawn inside the transfer module 9 indicates a swingable range of the third arm 63a in a state where the articulated arm is folded. In the case where the wafer W is held on the leading end of the third arm 63a, the tip end of the wafer W protrudes beyond the leading end of the third arm 63a in a normal state. Therefore, the dashed double-dotted line RA represents a trajectory of the tip end of the wafer W mounted on an extended line obtained by connecting the base end portion of the third arm 63a and the leading end portion thereof. The trajectory is obtained when the third arm 63a is rotated about the rotary shaft 67 thereof. Furthermore, a swing radius indicated by the dashed double-dotted line RA corresponds to the length L from the rotary shaft 67 provided in the base end portion of the third arm 63a to the tip end of the wafer W disposed on the leading end portion of the third arm 63a. The length L is larger than the first width W1 of the first transfer chamber 9a and smaller than the second width W2 of the second transfer chamber 9b (see the situation (c-4) of FIG. 4B).

[Operation of Transfer Mechanism in Transfer Module]

Figure 4A:
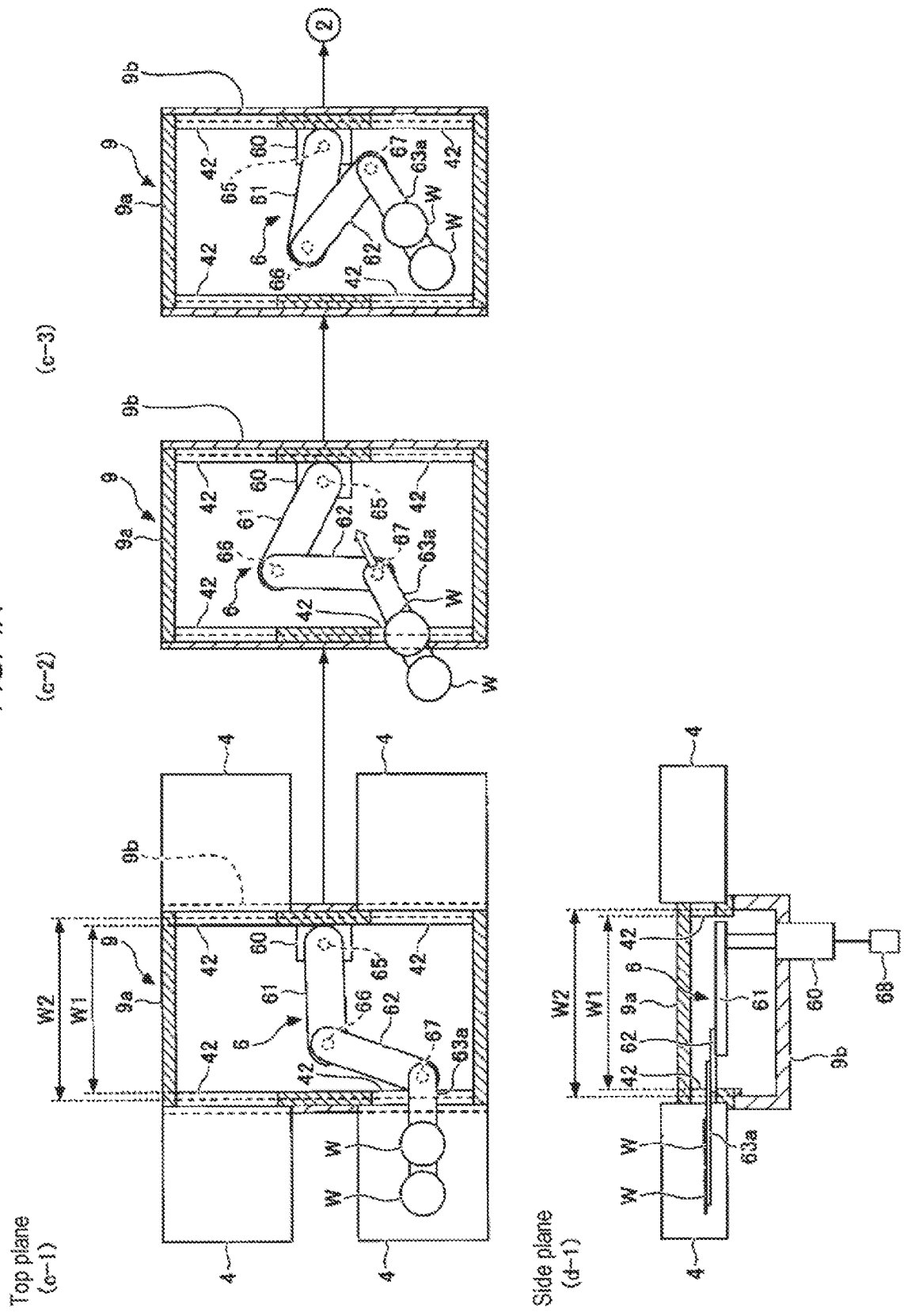
FIG. 4A is a view illustrating an example of a transfer mechanism according to an embodiment of the present disclosure.

Next, an example of the operation of the transfer mechanism 6 in the transfer module 9 according to the present embodiment will be described with reference to FIGS. 4A and 4B. In FIG. 4A, upper views illustrate top planes (planes) of the substrate processing apparatus, and a lower view illustrates a side plane thereof.

In an example illustrated in situations (c-1) and (d-1) of FIG. 4A, the first arm 61, the second arm 62, and the third arm 63a are raised up to the first transfer chamber 9a by the elevating mechanism 68. The third arm 63a enters the processing module 4 arranged on the lower left in situation (c-1) of FIG. 4A via the transfer port 42 to mount unprocessed wafers W at predetermined positions inside the processing module 4. Thereafter, the third arm 63a is withdrawn from the processing module 4. Once a predetermined processing is performed on the wafers W, as illustrated in situations (c-2) and (c-3) of FIG. 4A, the third arm 63a enters the processing module 4 through the transfer port 42 to unload the processed wafers W from the processing module 4. The first arm 61, the second arm 62 and the third arm 63a are accommodated in the first transfer chamber 9a.

In FIG. 4B following FIG. 4A, only the second transfer chamber 9b is illustrated in situations (c-4), (c-5) and (c-7) of FIG. 4B, and both the first transfer chamber 9a and the second transfer chamber 9b are illustrated in situations (c-6) and (c-8) of FIG. 4B.

As illustrated in situation (c-4) of FIG. 4B, since the first width W1 of the first transfer chamber 9a is smaller than the length L, as illustrated in situation (a-2) of FIG. 1A, the third arm 63a cannot be in the parallel state. As such, the third arm 63a of the articulated arm operates while moving obliquely with respect to the first width W1 inside the first transfer chamber 9a so as to load the wafers W into the processing module 4 via the transfer port 42 or unload the wafers W from the processing module 4.

Furthermore, when the third arm 63a is rotated inside the first transfer chamber 9a, the inner wall of the first transfer chamber 9a and the tip end of the wafer W interfere with each other when the third arm 63a is brought into the parallel state. Therefore, as illustrated in situations (c-4) and (d-2) of FIG. 4B, the transfer mechanism 6 is lowered by the elevating mechanism 68 to be accommodated in the second transfer chamber 9b from the first transfer chamber 9a.

As illustrated in situation (d-2) of FIG. 4B, after the transfer mechanism 6 is lowered by the elevating mechanism 68 and accommodated in the second transfer chamber 9b, each arm is rotated. Thus, it is possible to rotate the third arm 63a inside the second transfer chamber 9b without causing the wafer W to interfere with the inner wall of the transfer module 9.

With this configuration, the leading end portion of the third arm 63a is moved from the lower left to the upper left while being oriented toward the left side of the transfer module 9 (see situation (c-5) of FIG. 4B). Furthermore, the leading end portion of the third arm 63a is moved to the right side of the transfer module 9 by inverting the direction of the third arm 63a oriented toward the left side of the transfer module 9 to the right side (see situation (c-7) of FIG. 4B).

Subsequently, as illustrated in situation (d-3) of FIG. 4B, in the state where the third arm 63a is kept obliquely with respect to the parallel state, the transfer mechanism 6 is raised by the elevating mechanism 68 to be accommodated in the first transfer chamber 9a from the second transfer chamber 9b. With this configuration, since the third arm 63a is kept obliquely with respect to the parallel state, for example, as illustrated in situation (c-6) of FIG. 4B, even though the length L is larger than the first width W1, the transfer mechanism 6 can be accommodated in the first transfer chamber 9a. As illustrated in situations (c-6) and (c-8) of FIG. 4B, in a state where the third arm 63a is kept obliquely with respect to the parallel state in this way, the third arm 63a enters a subsequent processing module 4 through the transfer port 42 of the first transfer chamber 9a to mount the wafers W in the subsequent processing module 4. Thereafter, the third arm 63 is withdrawn from the subsequent processing module 4.

The operation of the articulated arm of the transfer mechanism 6 is controlled by the control part 100. According to the substrate processing apparatus 1 of the present embodiment, the extension/contraction operation of the articulated arm is performed by making the width dimensions of the transfer module 9 different from each other in the height direction, rotating the articulated arm inside the second transfer chamber 9b which is the lower region with a relatively large width dimension, and obliquely moving the articulated arm inside the first transfer chamber 9a which is the upper region with a relatively small width dimension. In this way, the wafers W are transferred.

With this configuration, the first width W1 of the first transfer chamber 9a can be smaller than the second width W2 of the second transfer chamber 9b by the stepped portions 9c of the transfer module 9 illustrated in FIG. 3. Thus, the transfer module 9 and the processing modules 4 have regions overlapping each other by the width of Ar when viewed from the top. Each of the processing modules 4 can be arranged inward of the transfer module 9 by a width of (W2-W1). This makes it possible to suppress the footprint of the substrate processing apparatus 1.

In some embodiments, other operations (the operation of linearly moving each arm forward or backward and the like) may be performed inside the second transfer chamber 9b together with the operation of rotating the third arm 63a. In addition, in the first transfer chamber 9a, the operation of rotating the third arm 63a to be kept in a parallel state cannot be performed, but other operations may be performed.

In the above, in the state in which the orientation of the third arm 63a is kept in situation (c-4) of FIG. 4B, in the case where the operation (situation (c-5) of FIG. 4B) in which the leading end portion of the third arm 63a is oriented in another direction and the operation (situation (c-7) of FIG. 4B) in which the orientation of the third arm 3a is in an inverted direction with respect to situation (c-4) of FIG. 4B are performed, when the third arm 63a is rotated inside the first transfer chamber 9a, the inner wall of the first transfer chamber 9a and the tip end of the wafer W has been described to interfere with each other when the third arm 63a is in a parallel state.

However, the interference between the articulated arm and the inner wall of the first transfer chamber 9a at the position where the transfer mechanism 6 is raised may occur at the base end portion of at least one of the first arm 61, the second arm 62, and the third arm 63a as well. For example, when the first arm 61 rotates about the rotary shaft 65, the base end portion of the first arm 61 and the inner wall of the first transfer chamber 9a adjacent to the base 60 may interfere with each other. This holds true with respect to the second arm 62 and the third arm 63a. Even in this case, it is possible to avoid the interference between the base end portion of at least one of the first arm 61, the second arm 62 and the third arm 63a and the inner wall of the first transfer chamber 9a by rotating the first arm 61, the second arm 62 and the third arm 63a inside the second transfer chamber 9b.

In some embodiments, the operation of orienting the leading end portion of the third arm 63a from one of the two processing modules 4 arranged side by side on the long side or the same side of the first transfer chamber 9a to the transfer port 42 of the other processing module 4 may be performed inside the first transfer chamber 9a as long as the first arm 61 and the second arm 62 are swingable in a large range without interfering with the inner wall of the transfer chamber 9a and the leading end portion of the third arm 63a can be oriented to the transfer port 42 without making contact with the inner wall of the first transfer chamber 9a. In this case, the elevation operation performed in situations (d-2) and (d-3) of FIG. 4B is omitted.

[Modifications]

Figure 5:
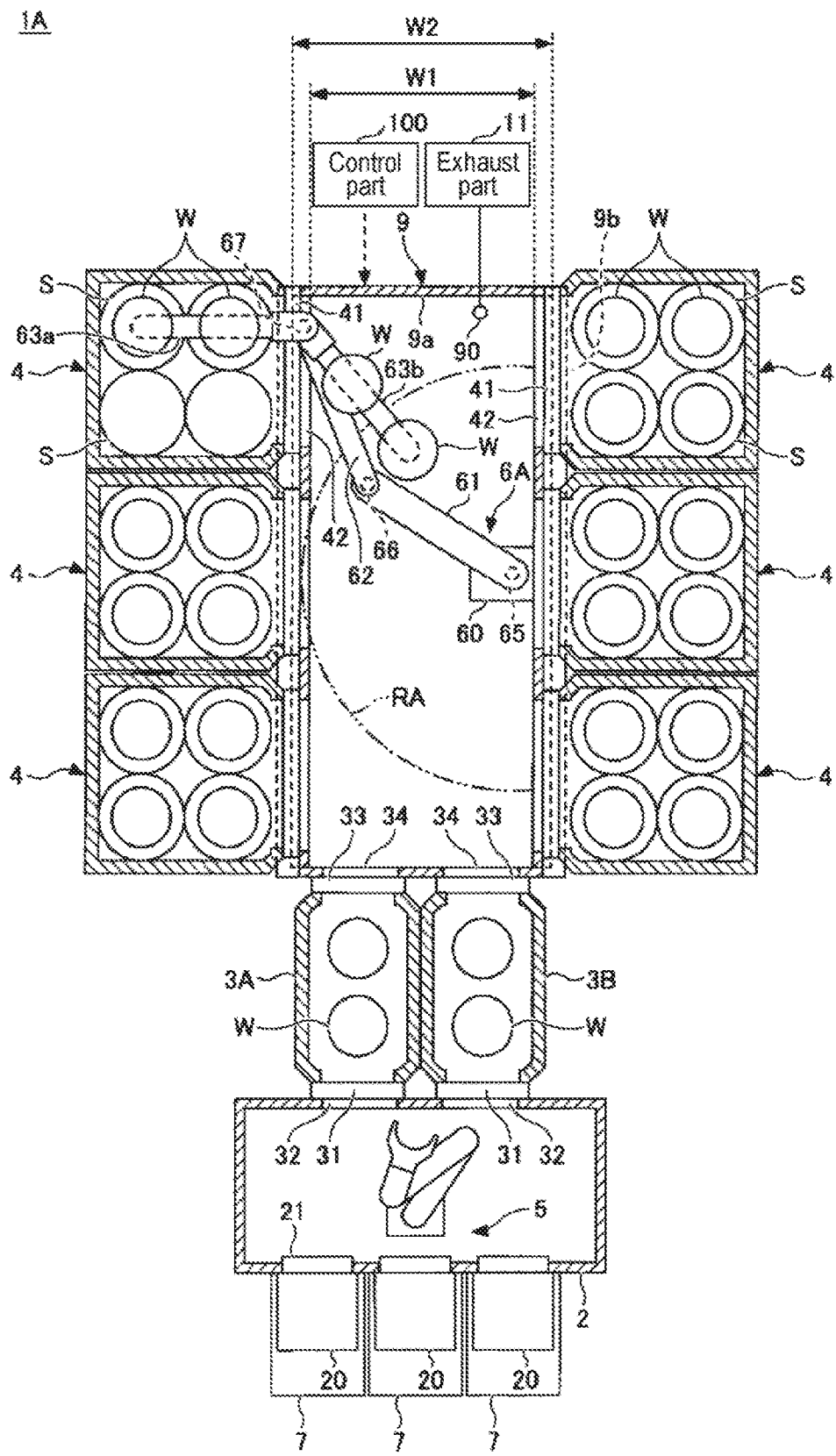
FIG. 5 is a view illustrating an example of a plane of a substrate processing apparatus according to a modification.
Figure 6:
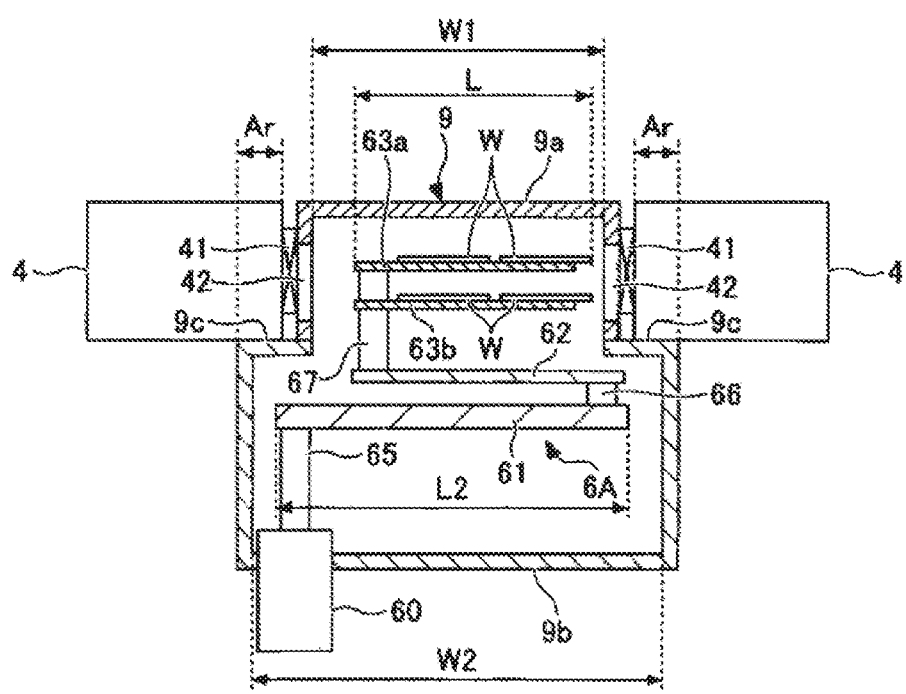
FIG. 6 is a view illustrating an example of a transfer mechanism according to a modification.

Next, an example of a substrate processing apparatus 1A and a transfer mechanism 6A according to a modification of the present embodiment will be described with reference to FIGS. 5 and 6. FIG. 5 is a view illustrating an example of a plane of the substrate processing apparatus 1A according to the modification of the present embodiment. FIG. 6 is a view illustrating an example of the transfer mechanism 6A according to the modification of the present embodiment.

Referring to FIG. 5, the substrate processing apparatus 1A according to the modification is different from the substrate processing apparatus 1 of the present embodiment illustrated in FIG. 2 in that the substrate processing apparatus 1A includes six processing modules 4 and an articulated arm is composed of four arms. Other configurations are identical to those of the substrate processing apparatus 1 in FIG. 2.

Referring to FIGS. 5 and 6, the base end portion of the third arm 63a and a base end portion of a fourth arm 63b are rotatably connected to the leading end portion of the second arm 62 via the rotary shaft 67 at an interval in the height direction.

Among the third arm 63a and the fourth arm 63b, the upper arm is assumed to be the third arm 63a and the lower arm is assumed to be the fourth arm 63b. The third arm 63a and the fourth arm 63b are identical to each other in configuration and are rotated independently of each other around the rotation shaft 67. Referring to FIG. 6, a length from the base end portion of the third arm 63a to the tip end of the outermost wafer W mounted on an extended line obtained by connecting the base end portion of the third arm 63a and the leading end portion thereof is set to "L". A length from the base end portion of the fourth arm 63b to the tip end of the outermost wafer W mounted on the extended line obtained by connecting the base end portion of the fourth arm 63b and the leading end portion thereof is also set to "L".

Each of the third arm 63a and the fourth arm 63b can mount a plurality of wafers W thereon in the longitudinal direction. In this modification, the third arm 63a and the fourth arm 63b hold two wafers W, respectively.

Therefore, in this modification, the third arm 63a and the fourth arm 63b can hold a maximum of four wafers W. In this configuration, the transfer mechanism 6 can efficiently transfer the wafers W between the six processing modules 4 and the transfer module 9 and between the transfer module 9 and the load lock modules 3A and 3B.

However, the configuration of the substrate processing apparatus 1A illustrated in FIG. 5 is an example of the substrate processing apparatus according to the present disclosure, and is not limited thereto.

Referring to FIG. 6, the transfer mechanism 6A according to this modification is configured such that the lengths of the third arm 63a and the fourth arm 63B are smaller than those of the first arm 61 and the second arm 62. Furthermore, in this modification, the length L from the base end portion of each of the third arm 63a and the fourth arm 63b to the tip end of the outermost wafer W mounted on the respective extended line is smaller than the first width W1 as illustrated in FIG. 6. In addition, the length L2 from the base end portion to the leading end portion of the first arm 61 is larger than the first width W1 and smaller than the second width W2.

In this configuration, the third arm 63a and the fourth arm 63B can be accommodated and swung in the first transfer chamber 9a. On the other hand, the first arm 61 and the second arm 62 cannot be accommodated and swung in the first transfer chamber 9a but can be accommodated and swung in the second transfer chamber 9b.

Therefore, in this modification, the first transfer chamber 9a accommodates the third arm 63a and the fourth arm 63b. On the other hand, the second transfer chamber 9b accommodates the first arm 61 and the second arm 62. Furthermore, each of the third arm 63a and the fourth arm 63b is an example of a fork located at the leading end of the articulated arm.

Thus, in this modification, the first arm 61 and the second arm 62 are swung and moved forward and backward inside the second transfer chamber 9b, and the third arm 63a and the fourth arm 63b are swung and moved backward and forward inside the first transfer chamber 9a so as to transfer the wafers W held on the third arm 63a and the fourth arm 63B to the processing module 4. This makes it possible to transfer the wafers W without moving the articulated arm up and down. These operations are controlled by the control part 100.

Even in this modification, the transfer module 9 includes stepped portions 9c. Thus, the transfer module 9 and the processing modules 4 have regions overlapping each other by the width of Ar when viewed from the top. As a result, the width of the substrate processing apparatus 1A can be reduced and thus the footprint of the substrate processing apparatus 1A can be suppressed. Further, according to this modification, the elevating mechanism of moving the articulated arm up and down and the operation of moving the articulated arm up and down become unnecessary. Moreover, in this modification, the transfer mechanism 6A including the articulated arm may be located, for example, at the center position on the long side of the transfer module 9, or may be located at a position shifted along the long side of the transfer module 9 from the center position thereof.

Figure 7:
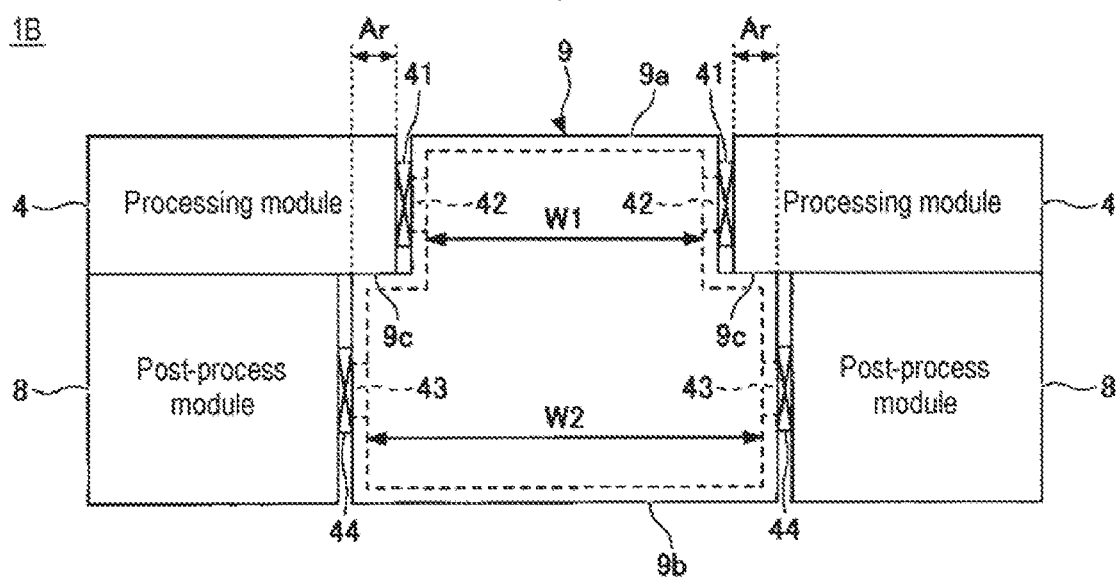
FIG. 7 is a view illustrating an example of a substrate processing apparatus according to another modification.

Next, a substrate processing apparatus 1B according to another modification will be described with reference to FIG. 7. FIG. 7 is a view illustrating an example of the substrate processing apparatus 1B according to another modification. FIG. 7 illustrates another example of the substrate processing apparatus 1B when viewed from plane taken along line A-A in FIG. 2, instead of FIG. 3.

The substrate processing apparatus 1B according to this modification is different from the substrate processing apparatus 1 in FIG. 3 in that the substrate processing apparatus 1B includes post-process modules 8. Other configurations of the substrate processing apparatus 1B are identical to those of the substrate processing apparatus 1 illustrated in FIG. 3.

In this modification, the processing modules 4 are arranged on both sides of the first transfer chamber 9a above the stepped portions 9c, and the transfer ports 42 are formed in the wall surface of the first transfer chamber 9a. Communication between the first transfer chamber 9a with the processing modules 4 is controlled by the gate valves 41 configured to open and close the transfer ports 42. The post-process modules 8 which have widths smaller than those of the processing modules 4 are arranged on both sides of the second transfer chamber 9b below the stepped portions 9c. Transfer ports 43 are formed in the wall surface of the second transfer chamber 9b. Communication with the second transfer chamber 9b with the post-process modules 8 is controlled by gate valves 44 configured to open and close the transfer ports 43. The post-process modules 8 may be arranged directly below the processing modules 4 or may be arranged to be shifted in the lengthwise direction of the second transfer chamber 9b.

Furthermore, outer end surfaces of the processing modules 4 and outer end surfaces of the post-process modules 8 are aligned with each other in the width direction of the substrate processing apparatus 1B. Therefore, even in this modification, the transfer module 9 and the processing modules 4 have regions overlapping each other by the width of Ar when viewed from the top. Further, since the outer end surfaces of the processing modules 4 and the outer end surfaces of the post-process modules 8 are aligned with each other, it is possible to suppress an increase in footprint of the substrate processing apparatus 1B.

In addition, in each of the post-process modules 8, a post-process subsequent to the process performed by the processing module 4 is executed. Examples of the post-process may include a degas process, an ashing process, and the like.

While the substrate processing apparatus according to the present disclosure has been described with reference to the aforementioned embodiments, the present disclosure is not limited to the aforementioned embodiments but may be differently modified and improved within the scope of the present disclosure. The matters described in the aforementioned embodiments may be combined unless a conflict arises.

For example, the present disclosure may be applied to a substrate processing apparatus in which a plurality of transfer modules 9 is provided. In this case, the transfer modules 9 that are connected in series inside the substrate processing apparatus are connected by a pass unit. Even in the substrate processing apparatus configured as above, the present disclosure may be applied to each of the plurality of transfer modules 9. This makes it possible to suppress an increase in footprint of the substrate processing apparatus.

In a case where a plasma mechanism is provided in the processing module according to the present disclosure, the present disclosure is applicable to any type of capacitively coupled plasma (CCP), inductively coupled plasma (ICP), radial line slot antenna, electron cyclotron resonance plasma (ECR), and helicon wave plasma (HWP).

In the present disclosure, the semiconductor wafer W has been described as an example of the substrate. However, the substrate is not limited thereto and may be various substrates used for a liquid crystal display (LCD) and a flat panel display (FPD), a CD substrate, a printed board, or the like.

According to the present disclosure in some embodiments, it is possible to suppress an increase in footprint of a substrate processing apparatus.

What is claimed is:

1. A substrate processing apparatus, comprising:
a polygonal transfer chamber;
a process chamber connected to the polygonal transfer chamber via a transfer port through which a substrate is transferred; and
a transfer mechanism provided in the polygonal transfer chamber and configured to transfer the substrate between the polygonal transfer chamber and the process chamber via the transfer port,
wherein the polygonal transfer chamber and the process chamber have regions overlapping each other when viewed from the top,
wherein the polygonal transfer chamber includes a stepped portion formed at a predetermined height,
wherein the polygonal transfer chamber includes a first transfer chamber located above the stepped portion and a second transfer chamber located below the stepped portion, and
wherein a first width between inner walls of the first transfer chamber adjacent to the process chamber is smaller than a second width between inner walls of the second transfer chamber in the same direction as a direction of the first width.

2. The apparatus of claim 1, wherein the transfer mechanism includes an articulated arm with a fork,
wherein the substrate is held on the fork,
wherein the first width is smaller than a length from a base end portion of the fork to a leading end of the substrate on an extension of a leading end portion of the fork, and
the second width is greater than a length from a base end portion of the fork to a tip end of the substrate which is mounted on an extended line obtained by connecting the base end portion of the fork and a leading end portion of the fork.

3. The apparatus of claim 2, wherein the articulated arm includes an elevating mechanism configured to move up and down in a height direction between the first transfer chamber and the second transfer chamber.

4. The apparatus of claim 3, wherein the articulated arm is further configured to change an orientation of the fork to another orientation in the second transfer chamber, following by move to the first transfer chamber by the elevating mechanism, followed by transfer the substrate to the process chamber via the transfer port in the first transfer chamber.

5. The apparatus of claim 2, wherein the first transfer chamber is configured to accommodate the fork, and
the second transfer chamber is configured to accommodate arms other than the fork of the articulated arm.

6. The apparatus of claim 2, wherein the articulated arm is further configured to operate the fork obliquely with respect to the first width in the first transfer chamber, and to transfer the substrate to the process chamber via the transfer port.

7. The apparatus of claim 2, wherein the transfer port is formed in the polygonal transfer chamber at a height at which at least one of the first transfer chamber and the second transfer chamber is provided.

8. The apparatus of claim 2, wherein the transfer mechanism includes a base connected to the articulated arm, and
the base is arranged adjacent to or close to an inner wall on a long side of the polygonal transfer chamber.

9. The apparatus of claim 2, wherein the fork is configured to mount a plurality of substrates thereon in a longitudinal direction.

10. The apparatus of claim 2, wherein a total length available when the articulated arm is folded is larger than the first width and smaller than the second width.

* * * * *